(12) United States Patent
Kasuga

(10) Patent No.: US 7,514,745 B2
(45) Date of Patent: Apr. 7, 2009

(54) SEMICONDUCTOR DEVICE

(75) Inventor: Masahiko Kasuga, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 332 days.

(21) Appl. No.: 11/393,874

(22) Filed: Mar. 31, 2006

(65) Prior Publication Data

US 2006/0226486 A1    Oct. 12, 2006

(30) Foreign Application Priority Data

Apr. 6, 2005    (JP)    ............... 2005-109624

(51) Int. Cl.
*H01L 27/12* (2006.01)
(52) U.S. Cl. ............... 257/347; 257/352; 257/E21.416; 257/E29.287; 257/E29.295
(58) Field of Classification Search ................. 257/347, 257/352
See application file for complete search history.

(56) References Cited

U.S. PATENT DOCUMENTS 4,735,917 A * 4/1988 Flatley et al. ............... 438/164

5,416,043 A    5/1995 Burgener et al.
2002/0145166 A1* 10/2002 Kachelmeier ............... 257/368
2003/0040158 A1    2/2003 Saitoh

FOREIGN PATENT DOCUMENTS

| JP | 52-127176 | * 11/1977 |
| JP | 05-326692 | 12/1993 |
| JP | 8-512432 | 12/1996 |
| JP | 2003-060076 | 2/2003 |
| JP | 2003-113000 | 4/2003 |

* cited by examiner

*Primary Examiner*—A. Sefer
(74) *Attorney, Agent, or Firm*—Volentine & Whitt, P.L.L.C.

(57) ABSTRACT

A semiconductor device which has a substrate formed as a rigid body, includes stress relaxation layers formed by filling in concave portions defined in a first main surface of the substrate, and a device forming layer which covers part of the first main surface and is formed in the substrate. The substrate is made up of a material larger than the stress relaxation layers and the device forming layer in thermal expansion coefficient. Side faces of the device forming layer are electrically connected to their corresponding upper surfaces of the stress relaxation layers in an electrically non-conducting state via insulative stress transfer layers formed on the upper surfaces.

16 Claims, 8 Drawing Sheets

SEMICONDUCTOR DEVICE

BACKGROUND OF THE INVENTION

The present invention relates to a semiconductor device formed on an SOS (Silicon On Sapphire) substrate.

There has heretofore been known a so-called SOI integrated circuit wherein an SOI (Silicon On Insulator) substrate formed by laminating a monocrystal silicon layer on an insulator is used and an elemental device such as a transistor is formed in the monocrystal silicon layer (refer to, for example, Japanese Unexamined Patent Publication No. Hei 5(1993)-326692).

The SOI integrated circuit is excellent in that as compared with an integrated circuit (hereinafter called a "silicon integrated circuit") fabricated in a single silicon substrate, (1) it is less reduced in parasitic capacitance and excellent in high-speed property, (2) it is resistant to soft errors, (3) there is no latch up, and (4) a well process can be omitted.

There has been known a so-called SOS integrated circuit as a type of SOI integrated circuit. The SOS integrated circuit is of an integrated circuit formed in an SOS substrate wherein a monocrystal silicon layer is epitaxially grown on a sapphire substrate used as an insulator. In addition to the advantages brought about by the above SOI integrated circuit, the SOS integrated circuit has an advantage that noise via the substrate is less reduced because the sapphire substrate is thick (refer to, for example, Japanese Unexamined Patent Publication No. Hei 8(1996)-512432).

However, the SOS integrated circuit involves essential problems that stem from its structure. The first point resides in that a lattice mismatch of about 10% exists between a lattice constant of a sapphire monocrystal and a lattice constant of a silicon monocrystal at room temperature. The second point resides in that the sapphire monocrystal is larger 60% than the silicon monocrystal in thermal expansion coefficient.

Therefore, inter-atomic distances in crystal lattices of the silicon monocrystal and the sapphire monocrystal are nearly equal at a temperature (approximately 1000° C.) at the time of epitaxial growth of the monocrystal silicon layer. With cooling subsequent to the epitaxial growth, however, the sapphire monocrystal is shrunk in a greater degree than the silicon monocrystal. As a result, large compression stress occurs in the monocrystal silicon layer.

The mobility of electrons in a stress direction in the monocrystal silicon layer is reduced at the rate of 30% to 40% due to the compression stress. Therefore, when an n channel MOS field effect transistor with electrons as carriers is formed in the monocrystal silicon layer, a source-to-drain current (saturation drain current) is reduced.

Several techniques applicable for solving a problem about the compression stress applied to the monocrystal silicon layer in the SOS substrate have been disclosed.

The first conventional technique relates to a technique for growing a monocrystal GaN layer on a sapphire substrate. In a manner similar to the silicon monocrystal, the GaN monocrystal is also smaller than the sapphire monocrystal in thermal expansion coefficient, and a difference of about 13% occurs between lattice constants of the two at room temperature. Therefore, strong compression stress occurs in the monocrystal GaN layer deposited on the sapphire substrate at room temperature. The first conventional technique intends to grow a layer made up of GaN or the like on the back surface (surface on the non-deposition side of the monocrystal GaN layer) of the sapphire substrate as a stress cancellation layer (refer to, for example, FIG. 1 of Japanese Unexamined Patent Publication No. 2003-113000).

The second conventional technique relates to a silicon integrated circuit. In order to relax compression stress in the direction parallel to a substrate surface concerned with a channel region of an n-MOSFET, the entire n-MOSFET is covered with an SiN film having tensile stress (refer to, for example, FIG. 1 of Japanese Unexamined Patent Publication No. 2003-60076).

SUMMARY OF THE INVENTION

The present invention has been made under such a background. It is therefore an object of the present invention to provide a semiconductor device capable of relaxing the above compression stress applied to the monocrystal silicon layer in the SOS substrate on the basis of the principle completely different from the first and second conventional techniques.

According to one aspect of the present invention, for achieving the above object, there is provided a semiconductor device which comprises a substrate, concave portions, stress relaxation layers, a device forming layer, stress transfer layers and an elemental device.

The substrate is insulative. The concave portions are respectively provided in opposing relationship so as to extend from a main surface of the substrate to part of thickness of the substrate. The stress relaxation layers are provided with being charged into the concave portions and have upper surfaces each parallel to the main surface. The device forming layer covers a region portion of the main surface, extending from an outer edge of one concave portion to an outer edge of the other concave portion. The stress transfer layers are insulative and provided so as to be mated with upper surfaces of the stress relaxation layers and side faces of the device forming layer. The elemental device is a transistor or the like and is configured using the device forming layer. And the substrate is formed of a material larger than the stress relaxation layers and the device forming layer in thermal expansion coefficient. Further, the substrate and the stress transfer layers have rigidity higher than the stress relaxation layers and the device forming layer.

In the semiconductor device according to the present invention, the device forming layer is made up of a material smaller than the substrate in thermal expansion coefficient and lower in rigidity than it. Therefore, the device forming layer undergoes compression stress in the direction (hereinafter called "parallel direction") parallel to the main surface from the substrate.

Since the stress relaxation layers are made up of a material smaller than the substrate in thermal expansion coefficient and lower in rigidity than it, and the surfaces other than their upper surfaces are mated with their corresponding side faces of the concave portions, the stress relaxation layers undergo compression stress in the direction (hereinafter called "vertical direction") orthogonal to the main surface from the substrate.

Thus, the upper surfaces exposed from the concave portions, of the stress relaxation layers and the side faces of the device forming layer are connected via the stress transfer layers thereby to make it possible to exert stress in the vertical direction on the side faces of the device forming layer.

Let's pay attention to atoms (hereinafter called "atoms in the neighborhood of a transfer layer side interface") constituting the device forming layer, which are bonded to atoms constituting each stress transfer layer at a boundary face or interface (hereinafter called "transfer layer side interface") between each of the stress transfer layers and the device forming layer. Stress in the vertical direction to which each stress relaxation layer is subjected is transferred to the side face of the device forming layer via the stress transfer layer. With the action of the vertical stress, the atoms in the neighborhood of the transfer layer side interface are displaced in the vertical direction. With their displacements, an interatomic distance between each of atoms (hereinafter called "inner atoms") bonded to the atoms in the neighborhood of the transfer layer side interface and each of the atoms in the neighborhood thereof becomes long. That is, the inter-atomic distance between each of the atoms in the neighborhood thereof and each of the inner atoms becomes long in the device forming layer.

Thus, the inter-atomic distance between each of the atoms in the neighborhood thereof and each of the inner atoms approaches a state in which the compression stress in the parallel direction is not exerted, so that the compression stress to which the device forming layer is subjected is relaxed.

According to the semiconductor device of the present invention, as described above, it is possible to relax the above parallel-direction compression stress applied to the monocrystal silicon layer in the SOS substrate on the basis of the principle completely different from the first and second conventional techniques, in which the stress in the vertical direction is exerted on the device forming layer formed with the n channel MOS field effect transistor. Thus, a reduction in mobility of electrons corresponding to carriers in the n channel MOS field effect transistor can be suppressed.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described with reference to the accompanying drawings. The shape, size and physical relationship of each constituent element in the figures are merely approximate illustrations to enable an understanding of the present invention. Preferred configurational examples of the present invention will be descried below. However, the material and numerical conditions of each constituent element, and the like are merely preferred examples. Accordingly, the present invention is by no means limited to the following embodiments.

Figure 1:
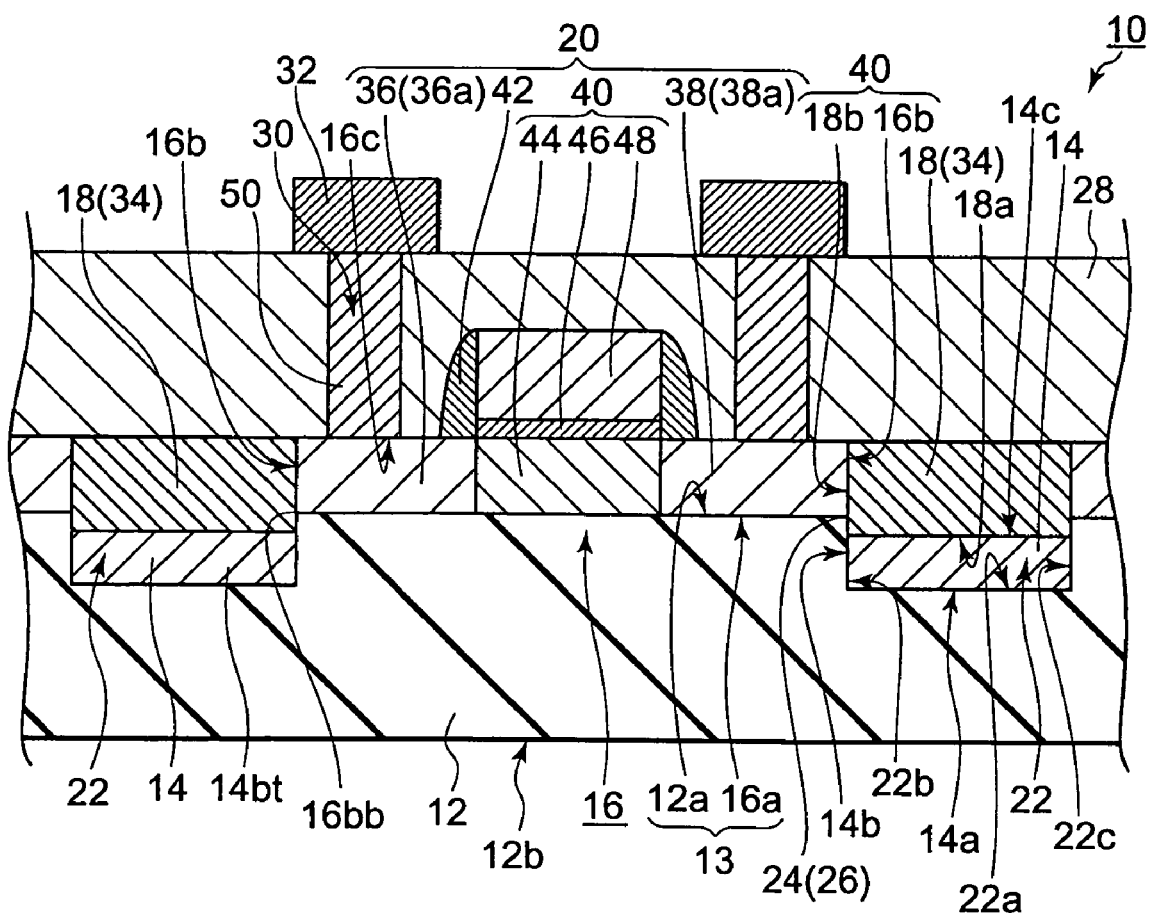
FIG. 1 is a view showing a sectional cut area of a semiconductor device according to an embodiment.

FIG. 1 is a sectional view for describing a configuration example of a semiconductor device according to the present embodiment. FIGS. 2 and 3 are respectively typical views for describing a mechanism for relaxing stress in the semiconductor device according to the present embodiment. FIGS. 4 through 6 are respectively process sectional views for describing a process for manufacturing the semiconductor device according to the present embodiment. FIGS. 7 and 8 are respectively fragmentary enlarged sectional views for describing modifications of the semiconductor device according to the present embodiment.

One preferred example of the structure of the semiconductor device according to the present embodiment will be explained with reference to FIG. 1.

The semiconductor device 10 includes a substrate 12, stress relaxation layers 14, a device forming layer 16 and stress transfer layers 18. Further, the semiconductor device 10 is provided with a MOSFET 20 (hereinafter called "n-MOSFET 20") of one conductivity type, e.g., n type, an intermediate insulating film 28, contact holes 30 and wirings 32. Incidentally, although the n-MOSFETs 20 are formed on both sides with the stress transfer layer 18 interposed therebetween, the following description will be made by paying attention to one n-MOSFET 20.

The substrate 12 is a flat plate including a first main surface 12a and a second main surface 12b parallel to each other. A pair of concave portions 22 and 22 are formed in the first main surface 12a on both sides in a gate length direction with the n-MOSFET 20 to be described later being interposed therebetween. Here, the gate length direction indicates the direction extending along the direction of migration of charges transferred through a channel section 44 in the n-MOSFET 20. The concave portion 22 has a bottom face 22a parallel to the main surface of the substrate 12, and four sidewalls vertical to the bottom face 22a and orthogonal to one another. In FIG. 1, particularly, a side face on the n-MOSFET 20 side is designated at 22b and a side face opposite to the side face 22b is designated at 22c respectively. The concave portion 22 has a sectional cut area extending along the gate length direction of the n-MOSFET 20, which is shaped in the form of a right quadrangle, and has a width greater than or equal to a gate width as viewed in a gate width direction (the direction orthogonal to the gate length direction within the first main surface 12a).

Now consider that the substrate 12 is formed of a material assumed to be substantially a rigid body with respect to the device forming layer 16 and the stress relaxation layer 14, i.e., not to be substantially deformed. The substrate 12 is formed as an insulative monocrystal substrate larger in thermal expansion coefficient (thermal expansion coefficient: device forming layer 16 and stress relaxation layer 14<substrate 12) than the device forming layer 16 and the stress relaxation layer 14. Incidentally, the thermal expansion coefficient means a volume expansion coefficient indicative of the rate of change in volume in the present embodiment. In the present embodiment, the substrate 12 makes use of, for example, a sapphire substrate (thermal expansion coefficient: approximately $5.0 \times 10^{-6}/°$ C.) whose thickness is preferably about 600 μm. However, the substrate 12 is by no means limited to it. An arbitrary and suitable material can be used according to design.

Preferably, each concave portion 22 is set to, for example, about 100 nm in depth, about 1 μm in length extending along the gate length direction, and 10 μm in length extending along the gate width direction. However, the concave portion 22 is by no means limited to them. The concave portion 22 can be set to arbitrary and suitable sizes according to design.

The device forming layer 16 is provided so as to cover the area excluding the concave portions 22 and 22, of the first main surface 12a. Therefore, the device forming layer 16 of course covers the area of the first main surface 12a, in which the n-MOSFET 20 to be described later is formed. Each side face 16b on the concave portion 22 side, of the device forming layer 16 is an extension of each sidewall of the concave portion 22 in continuation with the sidewall thereof. In other words, the side face 16b of the device forming layer 16 and the side face 22b of the concave portion 22 are formed on the same plane and connected to each other without any step. Thus, the device forming layer 16 is formed in a pattern having apertures or openings at spots corresponding to the concave portions 22.

Incidentally, a ridge where the side face 22b of the concave portion 22 intersect the first main surface 12a, is referred to as an "outer edge 26" of the concave portion 22.

The device forming layer 16 comprises a semiconductor monocrystal of other conductivity type, e.g., p type, which is epitaxially grown on the first main surface 12a of the substrate 12. Here, the surface where the first main surface 12a of the substrate 12 and a lower surface 16a of the device forming layer 16 are mated with each other, is called a "substrate-side boundary face or interface 13". I the present embodiment, the device forming layer 16 may preferably be formed as, for example, p-type monocrystal silicon (thermal expansion coefficient: approximately $2.5 \times 10^{-6}$/° C.) having a thermal expansion coefficient less than that of the substrate 12. If the device forming layer 16 is of the semiconductor monocrystal having the thermal expansion coefficient less than that of the substrate 12, then materials of arbitrary and suitable conductivity type corresponding to design can be used regardless of the p and n types and without a limit to the monocrystal silicon. Although the thickness of the device forming layer 16 is preferably set to, for example, approximately 100 nm, it is not limited to its thickness but can be set to an arbitrary and suitable thickness corresponding to design.

The device forming layer 16 is epitaxially grown on the first main surface 12a of the substrate 12 at a high temperature of a high temperature (approximately 1000° C.). Since the substrate 12 is larger than the device forming layer 16 in thermal expansion coefficient as mentioned above, the substrate 12 rather than the device forming layer 16 is volume-shrunk in a larger degree in a cooling process subsequent to the completion of deposition of the device forming layer 16. When the substrate 12 and the device forming layer 16 are cooled to room temperature, compression stress in the direction (hereinafter called "parallel direction") parallel to the first main surface 12a acts on the device forming layer 16 via the mating surface thereof with the substrate 12, i.e., the substrate-side interface 13.

Incidentally, the room temperature referred to above indicates a temperature range in which the compression stress of the parallel direction acts on the device forming layer 16 subsequent to being grown on the first main surface 12a. The room temperature contains temperatures not greater than a temperature equivalent to a heating temperature (about 100° C.) incident to the operation of the n-MOSFET 20 as well as room temperatures (ranging from 0° C. to 25° C.).

The stress relaxation layers 14 and 14 are formed over parts of the depths of the concave portions 22 and 22 so as to fill in the concave portions 22 and 22 with no space. The surface height of the stress relaxation layer 14 as viewed in the direction orthogonal to the first main surface 12a of the substrate 12 is formed low by about 10 nm from the distance, i.e., depth between the bottom face 22a of the concave portion 22 and the first main surface 12a. That is, an upper surface 14c of each stress relaxation layer 14 is made recessed slightly from the first main surface 12a. A lower surface 14a of the stress relaxation layer 14 is mated with the bottom face 22a of the concave portion 22. A side face 14b on the n-MOSFET 20 side, of the stress relaxation layer 14 is mated with its corresponding side face 22b of the concave portion 22. The upper surface 14c of the stress relaxation layer 14 is exposed at the concave portion 22 on the first main surface 12a side of the substrate 12.

In the present embodiment, the stress relaxation layer 14 may preferably be formed of, for example, monocrystal silicon having a thermal expansion coefficient less than that of the substrate 12. If the stress relaxation layer 14 is of the monocrystal having the thermal expansion coefficient less than that of the substrate 12, then an arbitrary and suitable material corresponding to design can be used without being limited to the monocrystal silicon.

The stress relaxation layer 14 is epitaxially grown within its corresponding concave portion 22 at a temperature of a high temperature (approximately 1000° C.). Since the substrate 12 is larger than the stress relaxation layer 14 in thermal expansion coefficient as mentioned above, the substrate 12 rather than the stress relaxation layer 14 is volume-shrunk in a larger degree in a cooling process subsequent to the completion of deposition of each stress relaxation layer 14. Thus, when the substrate 12 and the stress relaxation layer 14 are cooled to room temperature, compression stress in the direction (hereinafter called "vertical direction") orthogonal to the first main surface 12a acts on the stress relaxation layer 14 via the side faces 22b and 22c and the compression stress in the direction parallel to the first main surface 12a acts thereon via the bottom face 22a.

As already described, the upper surface 14c of each stress relaxation layer 14 is placed in a position lower than the first main surface 12a of the substrate 12. Thus, space is defined in the area surrounded by the upper surface 14c of the stress relaxation layer 14 and both side faces 22b and 22c of the concave portion 22 in the as-is state. Therefore, there are provided such stress transfer layers 18 that the space and the openings defined in the device forming layer 16 are buried and the surfaces thereof are placed in positions flush with an upper surface 16c of the device forming layer 16.

A lower surface 18a of each stress transfer layer 18 is mated with its corresponding upper surface 14c of the stress relaxation layer 14. One side face of the stress transfer layer 18, i.e., its side face 18b on the n-MOSFET 20 side is mated with the side face 22b of the concave portion 22 and the side face 16b of the device forming layer 16. Here, the surface where the side face 16b and the side face 18b are mated with each other, is referred to as a "transfer layer side boundary face or interlayer 17".

The stress transfer layer 18 can be considered to be a rigid body substantially as viewed from the device forming layer 16 and the stress relaxation layer 14. That is, the stress transfer layer 18 is formed of an insulator assumed not to be deformed. In the present embodiment, for instance, $SiO_2$ is preferably used as a material for constituting each stress transfer layer 18. If, however, the stress transfer layer 18 is of an insulator assumed to be a rigid body substantially, it is by no means limited to this insulator. An arbitrary and suitable material can be used according to design. The thickness of the stress transfer layer 18 is thicker than the device forming layer 16 by a charged upper end of the concave portion 22 and may preferably be set as 110 nm, for example.

The stress transfer layer 18 rigidly connects between the side face 16b of the device forming layer 16 and the upper face 14c of the stress relaxation layer 14. That is, both the faces 14 and 16 are connected in such a manner that the stress transfer layer 18 is capable of transferring stress from the upper surface 14c of the stress relaxation layer 14 to the side face 16b of the device forming layer 16. The stress transfer layer 18 may preferably share the use of a field oxide film 34 that electrically separates the n-MOSFET 20 to be described later and other elements adjacent to the n-MOSFET 20.

Thus, the connection of the upper surface 14c of the stress relaxation layer 14 and the side face 16b of the device forming layer 16 through the stress transfer layer 18 makes it possible to cause vertical compression stress that acts on the stress relaxation layer 14 from the substrate 12 to act on the device forming layer 16.

The n-MOSFET 20 is formed in the device forming layer 16 interposed between the pair of concave portions 22 and 22. A source region 36 used as a first main electrode region of the n-MOSFET 20, the channel section 44 and a drain region 38 used as a second main electrode region are respectively formed in partial regions of the device forming layer 16. In the same manner as conventional, a gate oxide film 46 is formed on the channel section 44, and a gate electrode 48 is formed on the gate oxide film 46. Further, sidewalls 42 are formed on their corresponding sidewalls of the gate oxide film 46 and gate electrode 48 so as to contact the device forming layer 16. Incidentally, a region containing the channel section 44, the gate oxide film 46 and the gate electrode 48 is called a "gate region 40".

In the n-MOSFET 20, the source region 36, the gate region 40 and the drain region 38 are disposed in series in this order from one concave portion 22 (left side as viewed in the drawing) to the other concave portion 22 (right side as viewed in the drawing). That is, the n-MOSFET 20 is formed in such a manner that its gate length direction extends along the direction parallel to a straight line that connects the two stress transfer layers 18 and 18 in the shortest distance.

The source region 36 and the drain region 38 are formed as n-type impurity layers 36a and 38a whose conductivity types are respectively changed to an n type, by introducing an n-type impurity into their corresponding region sections of the device forming layer 16 by the known method. Although, for example, P (phosphorus) is preferably used as the n-type impurity here, there is no restrain on it. Arbitrary and suitable impurities can be used according to design.

The gate region 40 is a region defined between the source region 36 and the drain region 38. The channel section 44 corresponds to a region of the device forming layer 16, which is interposed between the two n-type impurity layers 36a and 38a. Since no n-type impurity is introduced into this region, the conductivity type of the channel section 44 is a p type corresponding to the original conductivity type of the device forming layer 16.

Here, the gate oxide film 46 may preferably be formed of, for example, an $SiO_2$ film having a thickness of about 10 nm, which is formed by a wet $O_2$ oxidation method. As the gate electrode 48, may preferably be, for example, a polysilicon film having a thickness of about 400 nm, which is formed by a CVD method. The sidewalls 42 may preferably be formed of, for example, an $SiO_2$ film formed by a thermal oxidation method.

The n-MOSFET 20 ensures electrical insulation from other elements adjacent thereto owing to the stress transfer layers 18 each left as the field oxide film 34. Described more specifically, the side face 16b of the region section of the device forming layer 16, which constitutes the source region 36, and the side face 16b of the region section of the device forming layer 16, which constitutes the drain region 38, are connected to their corresponding side faces 18b and 18b of the field oxide films 34 (stress transfer layers 18). Thus, the field oxide film 34 is interposed between the n-MOSFET 20 and other elements adjacent thereto, so that the electrical insulation therebetween is attained.

There is a fear that since each of the stress relaxation layers 14 is made up of monocrystal silicon, a current leak occurs between the n-MOSFET 20 and other elements adjacent thereto via the stress relaxation layer 14. The reason why the height of the stress relaxation layer 14 is set lower than the depth of each concave portion 22 by, for example, about 10 nm to form a step, is to eliminate such a fear. Thus, the insulative substrate 12 and the field oxide film 34 are interposed between an upper end 14bt of the side face 14b of each stress relaxation layer 14 and a lower end 16bb of the side face 16b of the device forming layer 16 (source region 36 and drain region 38) of the device forming layer 16 to thereby ensure electrical insulation between each stress relaxation layer 14 and the device forming layer 16.

The intermediate insulating film 28 is laminated on a structure constituted of the n-MOSFET 20 and the field oxide films 34 (stress transfer layers 18). That is, the intermediate insulating film 28 is deposited over the entire surface of the upper side of the substrate 12 so as to cover the n-MOSFET 20. Preferably, the intermediate insulating film 28 is formed as, for example, a BPSG (Boron-Phospho Silicate Glass) film having a thickness of about 1.5 μm. And contact holes 30 each having such a depth as to expose the upper surface 16c of the device forming layer 16 are provided at spots corresponding to the upper sides of the source region 36 and the drain region 38, of the intermediate insulating film 28. The contact holes 30 are buried by their corresponding buried electrodes 50. Electrical conduction between the source region 36 and the drain region 38 is ensured by the buried electrodes 50. The wirings 32 are formed which are electrically connected to their corresponding upper ends of the buried electrodes 50. Here, each of the buried electrodes 50 may preferably be, for example, an Al layer formed by the CVD method. Each wiring 32 may preferably be, for example, an Al layer formed by the CVD method.

Thus, the semiconductor device 10 is formed using a so-called SOS substrate in which the layer (device forming layer 16) made up of monocrystal silicon is formed on the sapphire substrate (substrate 12).

A mechanism for stress relaxation of the semiconductor device 10 will next be explained with reference to FIGS. 2 and 3.

Figure 2A:
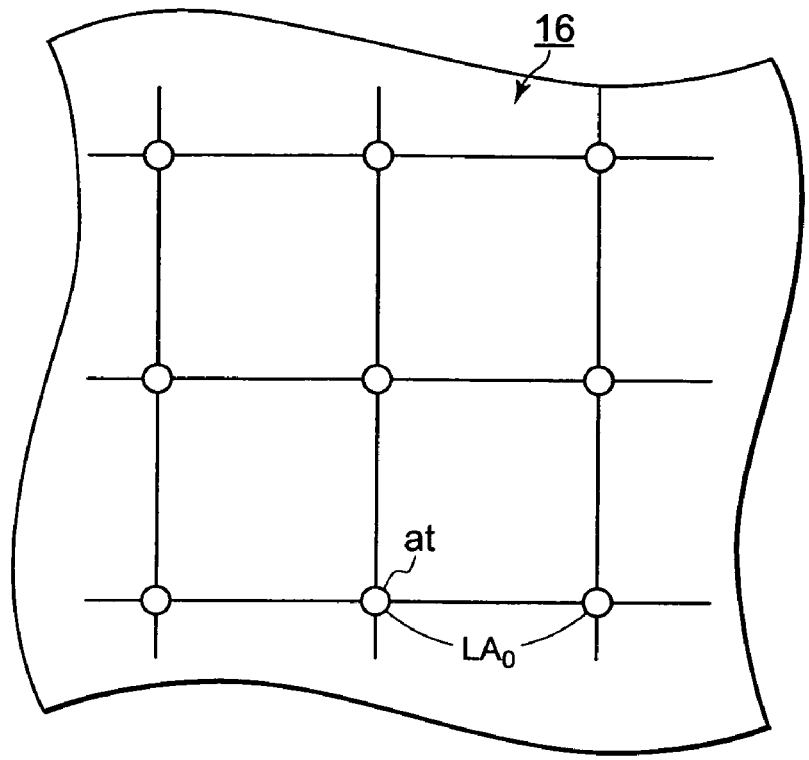
FIG. 2 is a typical view for describing a mechanism for relaxing stress in the semiconductor device according to the embodiment.
Figure 2B:
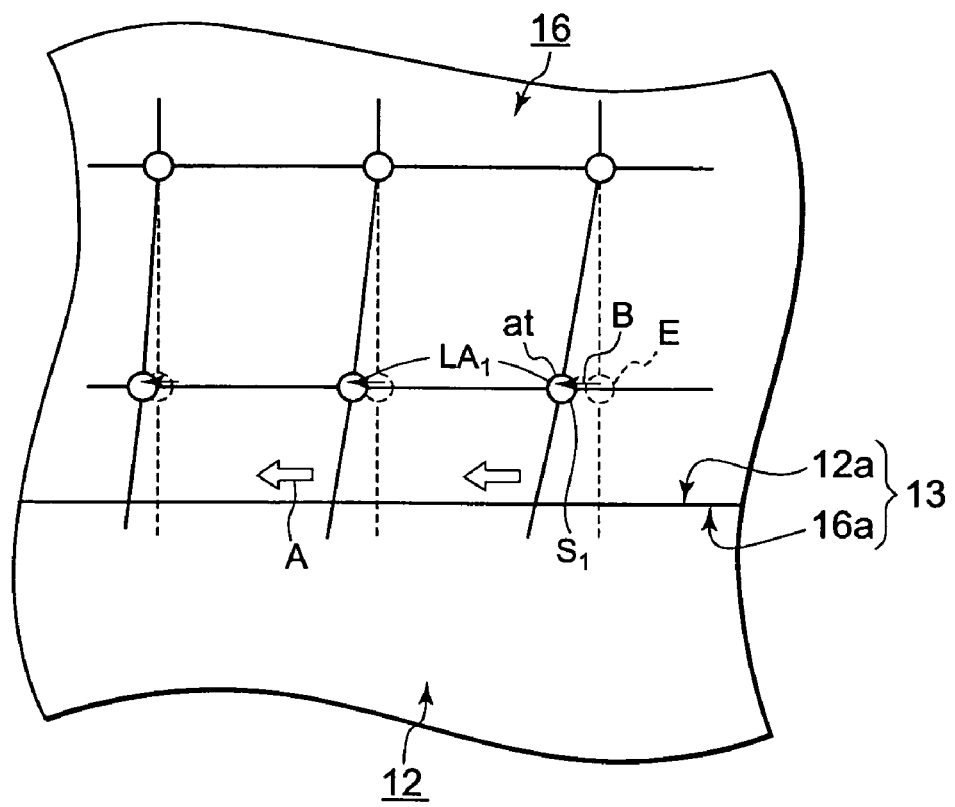
Figure 3:
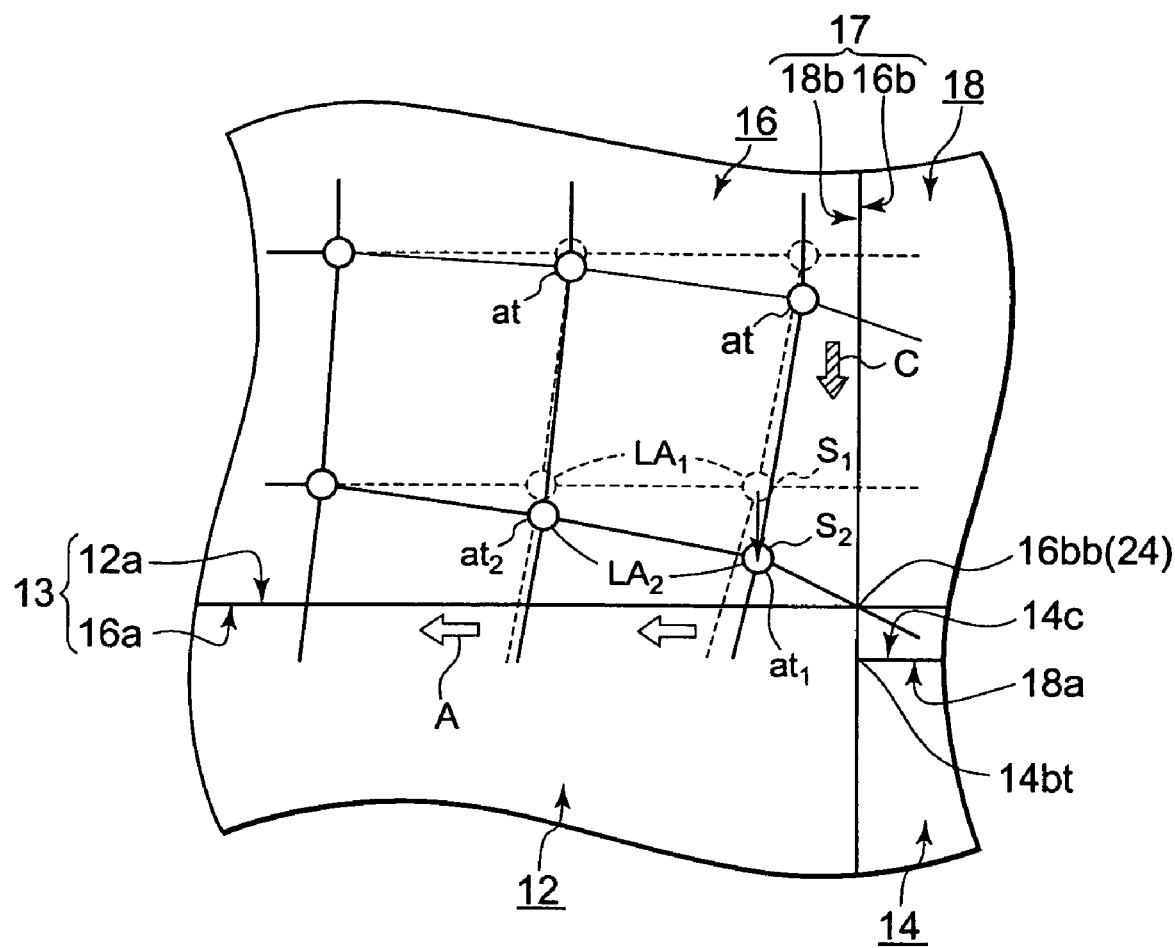
FIG. 3 is a typical view for describing a mechanism for relaxing stress in the semiconductor device according to the embodiment.

FIG. 2A is a typical view showing the state of bonding of atoms that constitute the device forming layer 16. Incidentally, FIG. 2A typically illustrates a state in which no stress acts on the device forming layer 16, i.e., the substrate 12 and the device forming layer 16 are not bonded to each other. FIG. 2B is a view typically showing a state in which compression stress in the parallel direction acts on the device forming layer 16, i.e., the substrate 12 and the device forming layer 16 are epitaxially bonded to each other. FIG. 3 is a view typically illustrating a state in which compression stress in the parallel direction and stress in the vertical direction act on the device forming layer 16, i.e., the device forming layer 16 is epitaxially bonded to the substrate 12 and the device forming layer 16 is connected to its corresponding stress relaxation layer 14 via the stress transfer layer 18. Incidentally, FIGS. 2 and 3 both show the states at room temperatures.

As shown in FIG. 2A, atoms at that constitute the device forming layer 16 are arranged on a regular basis while interatomic distances corresponding to distances $LA_0$ are being kept. Since stress does not act on the device forming layer 16 from any direction in this case, there is no difference between the inter-atomic distances $LA_0$ as viewed in the left-right direction (horizontal direction) within a plane containing the atoms shown in FIG. 2A and the direction orthogonal to the plane. Here, the inter-atomic distance $LA_0$ between the atoms at in a stress-action free state, i.e., normal state is referred to as a "normal-state inter-atomic distance $LA_0$".

When the device forming layer 16 is bonded to the substrate 12 as shown in FIG. 2B, compression stress in the direction (parallel direction) parallel to the substrate-side interface 13 is introduced into the device forming layer 16 through the substrate-side interface 13 (as indicated by open arrows A in FIG. 2B). That is, since the thermal expansion coefficient of the substrate 12 is larger than that of the device forming layer 16 as described above, the substrate 12 is placed in a shrunk state than the device forming layer 16 at room temperature. Thus, if attention is focused on atoms at bonded to substrate atoms through the substrate-side interface 13, the atoms at are displaced in the direction parallel to the first main surface 12a so as to be pulled toward the substrate atoms.

As a result, each atom at bonded to the substrate atom is displaced from a position E placed in the normal state indicated by a virtual line in FIG. 2B to a position $S_1$ in the parallel direction (as indicated by arrows B in FIG. 2B). Thus, the inter-atomic distance in the direction parallel to the first main surface 12a between the atoms at bonded to the substrate atoms results in $LA_1$ shorter than the normal-state inter-atomic distance $LA_0$ ($LA_0 > LA_1$) This can result in action of the compression stress in the parallel direction on the device forming layer 16. On the other hand, since no stress acts in the vertical direction, no displacement of each atom at occurs.

As shown in FIG. 3, the device forming layer 16 is bonded to both the substrate 12 and the stress transfer layers 18. Thus, the device forming layer 16 undergoes the compression stress in the parallel direction as described by reference to FIG. 2B (as indicated by open arrows A in FIG. 3), so that the interatomic distance between atoms at in the neighborhood of the substrate-side interface 13 changes to $LA_1$. Further, since the side face 18b of the stress transfer layer 18 is bonded to or mated with its corresponding side face 16b of the device forming layer 16, atoms (hereinafter called also "atoms in the neighborhood of a transfer layer side interface") at in the neighborhood of the transfer layer side interface 17 are displaced in the vertical direction over the entire area of the side face 16b.

More specifically, the compression stress in the vertical direction acts on the stress relaxation layers 14 as described above. Each stress transfer layer 18 substantially regarded as the rigid body is connected to the upper surface 14c of the stress relaxation layer 14 and the side face 16b of the device forming layer 16. Due to these facts, the vertical compression stress that acts on the stress relaxation layer 14 acts on the side face 16b of the device forming layer 16 through the stress transfer layer 18 as stress directed to the first main surface 12a. That is, the vertical compression stress that acts on each stress relaxation layer 14 acts on the side face 16b of the device forming layer 16 through the stress transfer layer 18 (as indicated by arrow C in FIG. 3). Thus, atoms at, which exist in the vicinity of the transfer layer side interface 17, are vertically displaced toward the first main surface 12a. Let's now pay attention to atoms $at_1$ that exist in the vicinity of the substrate-side interface 13 and the transfer layer side interface 17, i.e., atoms $at_1$ that exist in the vicinity of the lower end (corner portion) 16bb of the device forming layer 16. Each of the atoms $at_1$ is vertically displaced from a position $S_1$ at the time of action of only the parallel-direction compression stress, which is indicated by a virtual line in FIG. 3, to a position $S_2$. Now consider an inter-atomic distance $LA_2$ between the atom $at_1$ and each of atoms $at_2$ adjacent to one another in the parallel direction. $LA_2$ increases as compared with $LA_1$ ($LA_2 > LA_1$). That is, the inter-atomic distance $LA_2$ between the atoms $at_1$ and $at_2$ constituting the device forming layer 16 approaches a normal-state inter-atomic distance $LA_0$ with the action of the vertical stress. Approaching the interatomic distance approaches $LA_0$ means that the device forming layer gets close to a state in which no parallel-direction compression stress acts thereon, i.e., the compression stress in the parallel direction is relaxed at the device forming layer 16.

Allowing the compression stress acting on each stress relaxation layer 14 to act on the side face 16b of the device forming layer 16 through the stress transfer layer 18 enables relaxation of the compression stress in the horizontal direction that acts on the device forming layer 16.

Incidentally, the compression stress in the parallel direction also acts on each stress relaxation layer 14 in a manner similar to the device forming layer 16. Since, however, the compression stress in the parallel direction is, so to speak, an internal force, it is of no use in relaxing the parallel-direction compression stress of the device forming layer 16. Thus, the parallel-direction compression stress that acts on the stress relaxation layer 14 is ignored in the above description.

A method for manufacturing the semiconductor device 10 will next be explained with reference to FIG. 1 and FIGS. 4 through 6.

Figure 4A:
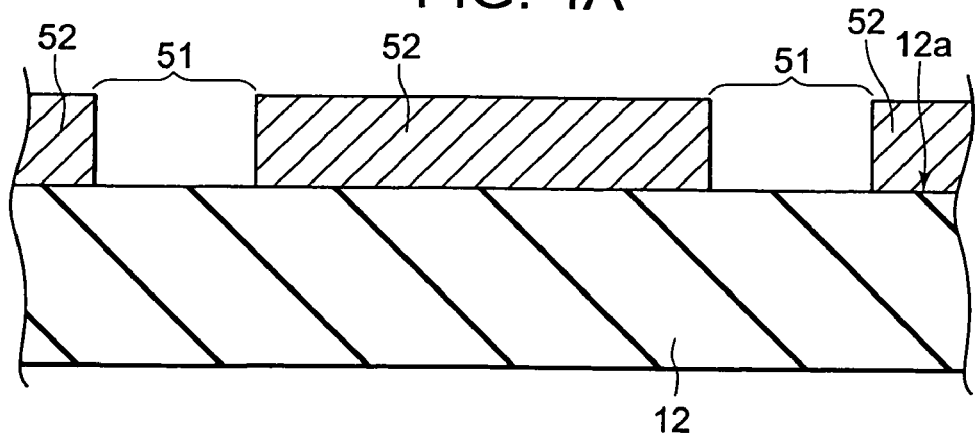
FIG. 4 is a view showing sectional cut areas at principal process steps, for describing a process for manufacturing the semiconductor device according to the embodiment.

(1) A sapphire substrate 12 is first prepared as shown in FIG. 4A. And ones other than predetermined regions 51 and 51 for forming a pair of concave portions 22 and 22 in a first main surface 12a of the sapphire substrate 12 are covered with an etching protective film 52 such as a photoresist.

Figure 4B:
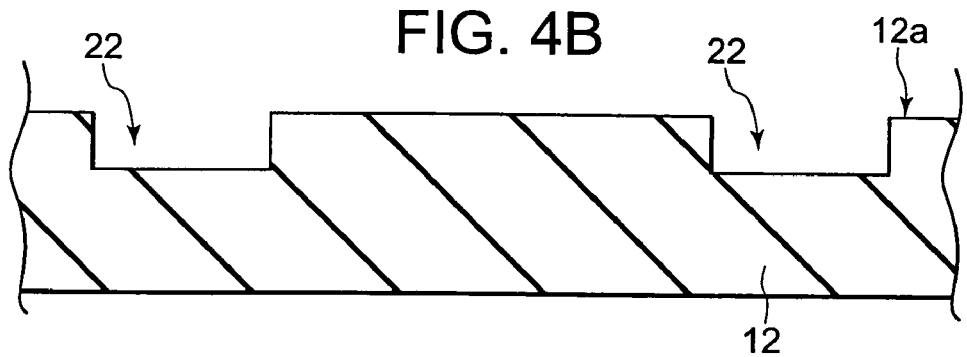

(2) Next, as shown in FIG. 4B, the sapphire substrate 12 is physically etched from its main surface 12a side by sputtering or the like to form the pair of concave portions 22 and 22 which are about 100 nm in depth as viewed from the first main surface 12a. Thereafter, the etching protective film 52 is removed by the known method.

Figure 4C:
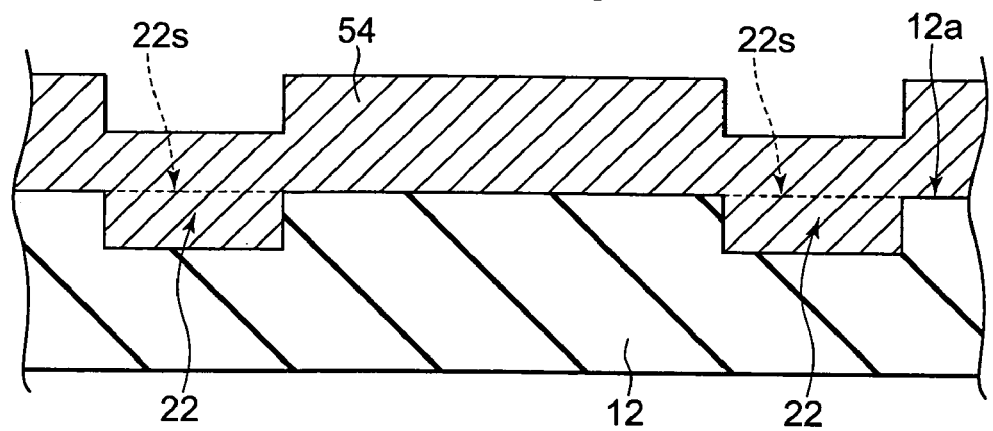

(3) Next, as shown in FIG. 4C, a first silicon layer 54 is epitaxially grown on the entire area of the first main surface 12a containing the concave portions 22. Described specifically, preferably, the substrate formed with the concave portions 22 and 22 is placed in a reaction container in which the temperature is kept at about 100° C. Then, the first silicon layer 54 is epitaxially grown by a CVD method (thermal decomposition method) while $SiH_4$ is being supplied as a raw material gas. The first silicon layer 54 is grown over the thickness at which at least the interiors of the concave portions 22 are all merely filled with the first silicon layer 54. In other words, the first silicon layer 54 is grown with such a thickness that the concave portions 22 are buried thereby to at least open surfaces 22s.

Figure 4D:
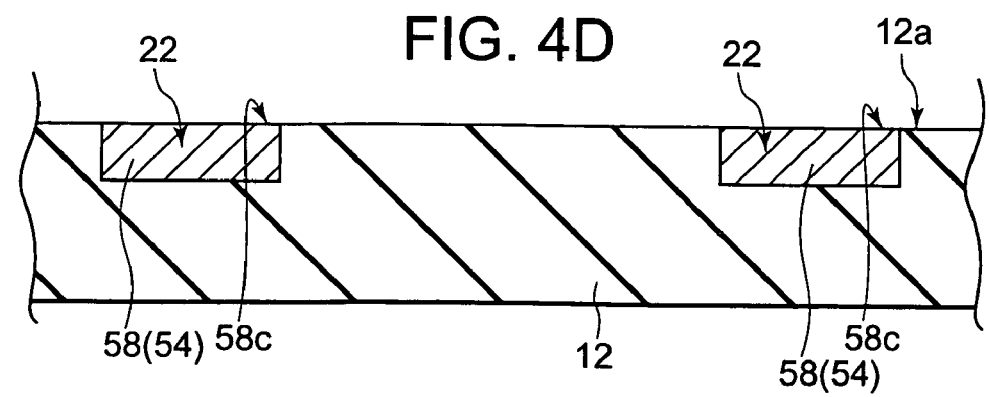

(4) Next, as shown in FIG. 4D, CMP (Chemical Mechanical Polishing) is effected on the substrate 12 formed with the first silicon layer 54 until the first main surface 12a of the sapphire substrate 12 is exposed again. Described in more detail, the substrate 12 is self-rotated while silica slurry is being suitably supplied and the first main surface 12a is being pressed against a polishing pad to thereby remove the first silicon layer 54 in a region other than the concave portions 22 and 22. Thus, the first silicon layer 54 lying in each concave portion 22 remains as a stress relaxation precursor 58. An upper surface 58c (surface exposed from each open surface 22s) of the stress relaxation precursor 58 and the first main surface 12a are positioned to the same plane by CMP. That is, the upper surface 58c and the first main surface 12a result in planarized surfaces connected without any step.

Figure 5A:
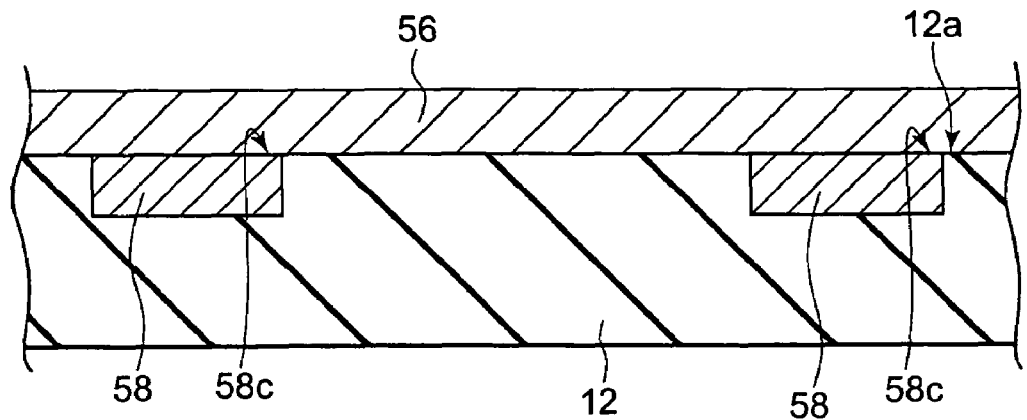
FIG. 5 is a view illustrating sectional cut areas at principal process steps, for describing the process for manufacturing the semiconductor device according to the embodiment.

(5) Next, as shown in FIG. 5A, a second silicon layer 56 is epitaxially grown so as to continuously cover the first main surface 12a of the sapphire substrate 12 and the upper surface 58c of the stress relaxation precursor 58. This specific procedure is similar to the process (3). Since the second silicon layer 56 has the upper surface formed as a flat surface and results in a device forming layer 16 in a subsequent process, its conductivity type is set as a p type. Therefore, $SiH_4$ corresponding to the raw material gas is mixed with $B_2H_6$ having a predetermined concentration as dopant gas. The second silicon layer 56 is grown until its thickness reaches about 100 nm, for example.

Figure 5B:
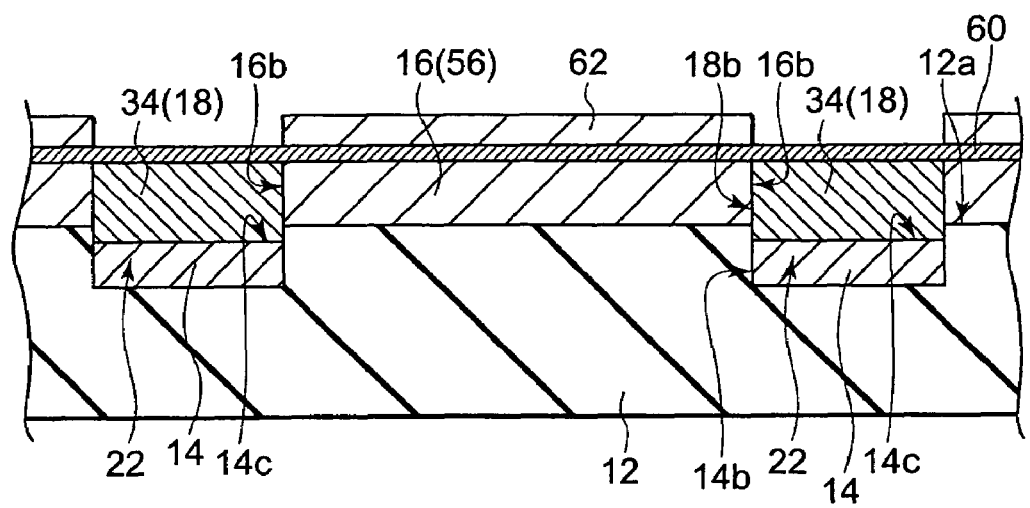

(6) Next, as shown in FIG. 5B, field oxide films 34 (stress transfer layers 18) are formed to carry out device isolation. To this end, a thin $SiO_2$ film 60 having a thickness of about 35 nm is formed over the entire surface of the second silicon layer 56 as a base or bed film for field oxidation. Thereafter, an $Si_3N_4$ film 62 as an antioxidant film, which is preferably about 100 nm, is deposited on the region interposed between the pair of stress relaxation precursors 58 and 58 by a low pressure thermal CVD method. Described more specifically, $SiH_2Cl_2$ and $NH_3$ are caused to react in an atmosphere in which, preferably, pressure is about 13.3322 Pa (0.1 torr) and the temperature is about 800° C. to thereby grow a $Si_3N_4$ film 62.

Thereafter, the second silicon layer 56 is thermally oxidized with the $Si_3N_4$ film 62 as a mask to form field oxide films 34 (stress transfer layers 18). Described more specifically, oxidation is preferably done under an atmosphere of steam at a temperature of about 1000° C. Incidentally, at this time, oxidation is continuously carried out for a predetermined time even after the oxidation over the entire thickness of the second silicon layer 56 has been completed, thereby to oxidize the stress relaxation precursors 58 over depths deeper than the upper surfaces 58c of the stress relaxation precursors 58, i.e., preferably, a thickness of about 10 nm as viewed from the upper surfaces 58c. With the oxidizing processing, the field oxide films 34 (stress transfer layers 18) each having such a form that a region portion on the bottom face (lower surface 18a) side is fit or intruded in the upper side of each concave portion 22, stress relaxation layers 14 left as non-oxidized region portions of the stress relaxation precursors 58, and the device forming layer 16 corresponding to the region of the second silicon layer 56, which is partitioned by the field oxide films 34 (stress transfer layers 18), are formed.

Thus, the upper faces 14c of the stress relaxation layers 14 and the side faces 16b of the device forming layer 16 are respectively connected via the field oxide films 34 (stress transfer layers 18), so that parallel-direction compression stress that acts on the device forming layer 16 is relaxed.

Incidentally, although the side face 18b of each field oxide film 34 (stress transfer layer 18) is formed with being deformed with respect to the side face 14c of each stress relaxation layer 14 by the oxidation treatment and hence the flatness of each of the side face 14b and the side face 18b is slightly deteriorated, the side face 14b and the side face 18b are considered to be a continuous vertical wall surface.

Figure 5C:
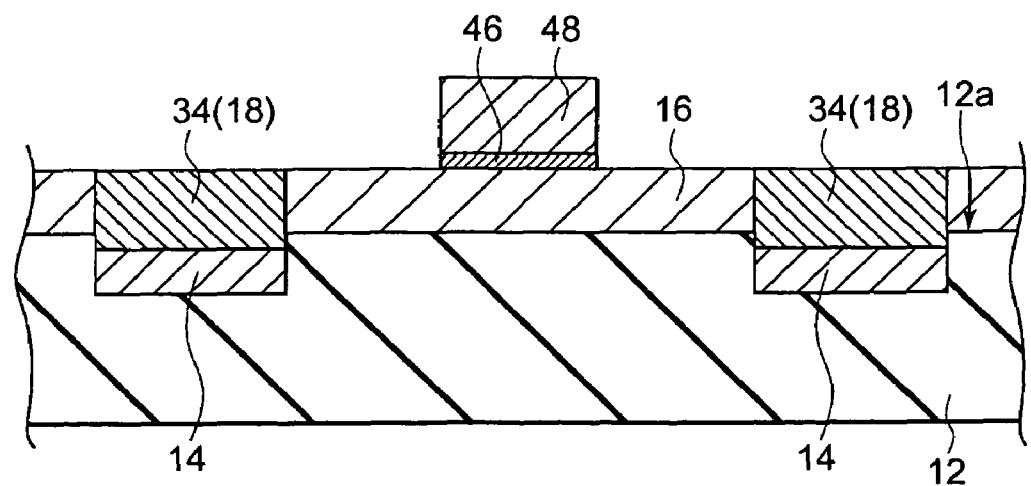

(7) Next, as shown in FIG. 5C, the $Si_3N_4$ film 62 and the $SiO_2$ film 60 are removed, and a gate oxide film 46, which is preferably about 10 nm in thickness and about 0.25 μm in length as viewed along the gate length direction, is formed in a predetermined position of the device forming layer 16 by a wet $O_2$ oxidation method. A polysilicon film, which is preferably about 200 nm in thickness, is grown on the gate oxide film 46 as a gate electrode 48 by using the CVD method.

Figure 6A:
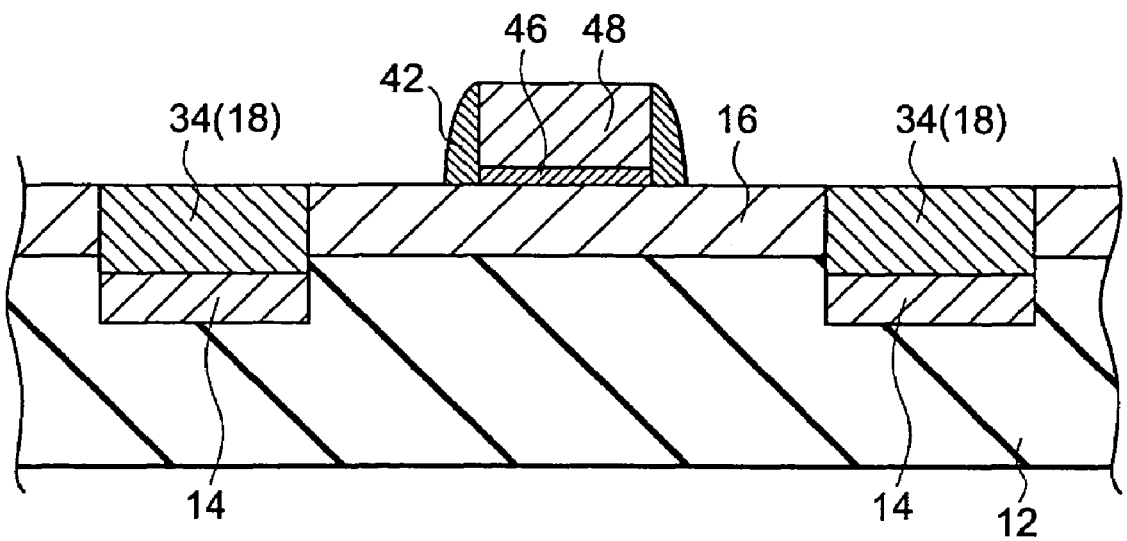
FIG. 6 is a view depicting sectional cut areas at principal process steps, for describing the process for manufacturing the semiconductor device according to the embodiment.
Figure 7A:
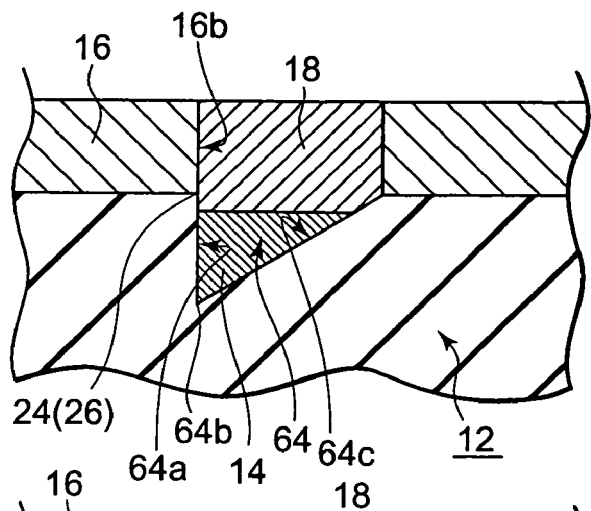
FIG. 7 is a fragmentary enlarged sectional view for describing a modification of the semiconductor device according to the embodiment.

(8) Next, as shown in FIG. 6A, both side faces on the sides of source and drain regions 36 and 38, of a laminated body made up of the gate oxide film 46 and the gate electrode 48 are oxidized using a thermal oxidation method to form sidewalls 42.

Figure 6B:
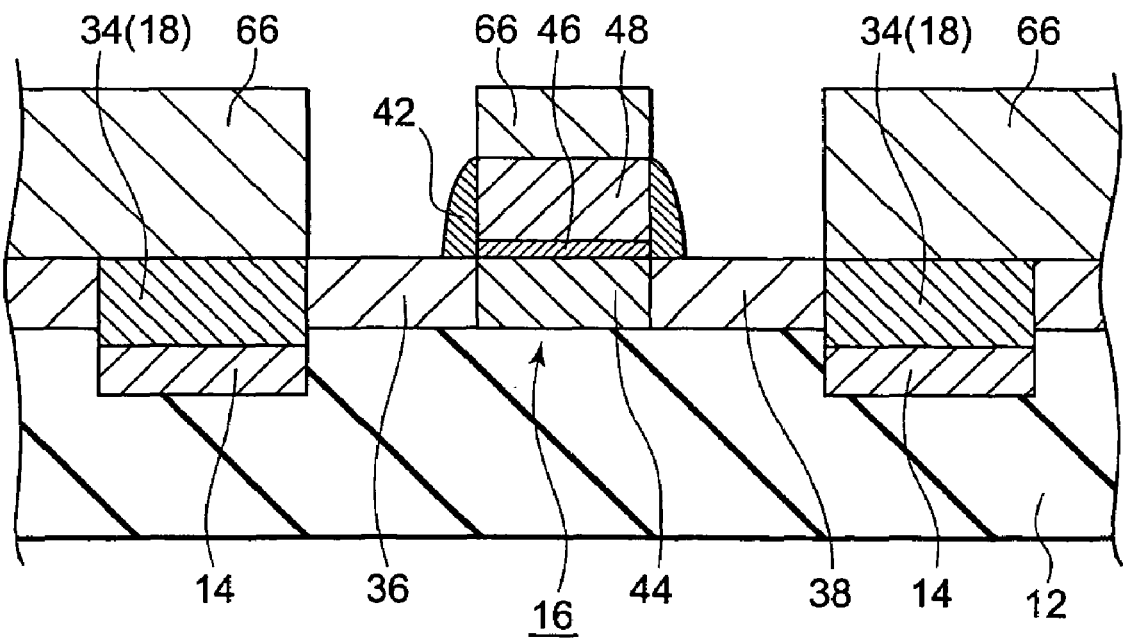

(9) Next, as shown in FIG. 6B, those other than the regions corresponding to the source region 36 and the drain region 38 at the upper surface on the gate electrode 48 side, of a structure shown in FIG. 6A are covered with an ion implantation protective film 66 such as a photoresist. Thereafter, P corresponding to an n type impurity is ion-implanted in the device forming layer 16. Consequently, the ion-implanted regions result in the source region 36 and drain region 38 whose conductivity types are respectively an n type. Thus, an n-MOSFET 20 having a channel section 44 and electrode regions is formed in the device forming layer 16.

(10) Finally, as shown in FIG. 1, the ion implantation protective film 66 is removed and thereafter an intermediate insulating film 28 comprised of a BPSG film which is preferably about 1.5 μm in thickness, is grown over the upper entire surface of the n-MOSFET 20 by the CVD method. And contact holes 30 having such depths as to expose the upper surface 16c of the device forming layer 16 are respectively provided at spots corresponding to the source region 36 and drain region 38 of the intermediate insulating film 28. Al deposited by the CVD method is embedded in the contact holes 30 to form embedded electrodes 50. Finally, wirings 32 made of Al connected to the embedded electrodes 50 are formed by the CVD method to obtain a semiconductor device 10.

Thus, in the semiconductor device 10 of the present embodiment, the upper surfaces 14c exposed from the concave portions 22, of the stress relaxation layers 14 and the side faces 16b of the device forming layer 16 are connected via the stress transfer layers 18 to allow the vertical stress to act on the device forming layer 16. That is, the vertical stress to which each stress relaxation layer 14 is subjected due to thermal shrinkage, is transferred to the side face 16b via the stress transfer layer 18. With the action of the vertical stress, atoms (hereinafter called "atoms in the neighborhood of a transfer layer side interface") existing in the neighborhood of a transfer layer side interface 17, which are within the stress transfer layer 18, are displaced in the vertical direction. With the displacements in the vertical direction, an inter-atomic distance between each of atoms (hereinafter called "inner atoms"), which exist inside the device forming layer 16 and are bonded to the atoms in the neighborhood of the transfer layer side interface, and each of the atoms in the neighborhood of the transfer layer side interface becomes long.

Thus, the inter-atomic distance between the atom in the neighborhood of the transfer layer side interface and the inner atom approaches a normal state and hence the compression stress to which the device forming layer is subjected is relaxed.

It is also thus possible to relax the compression stress applied to the monocrystal silicon layer (device forming layer 16), which has become the problem in the conventional SOS integrated circuit. Thus, a reduction in the mobility of electrons in the monocrystal silicon layer (device forming layer 16) as viewed in the direction in which the compression stress acts can be suppressed. As a result, a reduction in saturation drain current can be suppressed in the n-MOSFET 20 formed in the monocrystal silicon layer.

Since the upper surface 14c of each stress relaxation layer 14 is formed so as to be lower than the first main surface 12a of the substrate 12 in the semiconductor device 10 of the present embodiment, electrical insulating properties between the source region 36 and drain region 38 and the stress relaxation layers 14 are ensured.

In the semiconductor device 10 of the present embodiment as well, the compression stress in the gate length direction to which the device forming layer 16 is subjected, is relaxed in the region interposed between the pair of concave portions 22 and 22 formed along the gate length direction, i.e., the pair of stress relaxation layers 14 and 14. Thus, in the n-MOSFET 20 formed in the region, a reduction in the mobility of electrons in the gate length direction can be suppressed as compared with the non-provision of the stress relaxation layers 14 and 14.

Further, in the semiconductor device 10 of the present embodiment, there is no need to provide the field oxide films aside from the stress transfer layers 18 because the stress transfer layers 18 share the use of the field oxide films 34. Thus, the size of the semiconductor device 10 is not scaled up as compared with the conventional one.

Incidentally, in the present embodiment, each of the stress relaxation layers 14 has allowed the vertical compression stress, i.e., the stress directed to the first main surface 12a to act on the device forming layer 16 via the stress transfer layer 18. However, stress in the direction kept away from the first main surface 12a, i.e., tensile stress may be applied to the device forming layer 16 by using a material larger in thermal expansion coefficient than the substrate 12 as each stress relaxation layer 14. Even by doing so, the horizontal compression stress that acts on the device forming layer 16 can be relaxed.

In the present embodiment as well, the SiO$_2$ film is used as each of the stress transfer layers 18 to allow the stress transfer layer 18 to have such a configuration as to share the use of the field oxide film 34. However, if the insulating property of the device forming layer 16 can be ensured by another method, then various materials each substantially regarded as a rigid body with respect to the device forming layer 16 and the stress relaxation layer 14 can be used as the stress transfer layers 18. For example, a monocrystal silicon layer, an SiN layer, etc. can be used.

Although the shape of each concave portion 22 has the sectional cut area extending along the gate length direction, which is shaped in the form of the right quadrangle, there is no restraint on the shape of the concave portion 22. If the stress relaxation layer 14 is capable of exerting vertical compression stress sufficient in magnitude (magnitude at which the atoms in the neighborhood of the transfer layer side interface can merely be displaced in the vertical direction) on each side face 16b of the device forming layer 16 via the stress transfer layer 18, then the concave portion 22 can be set to an arbitrary and suitable shape according to design. For instance, a concave portion 64 wedged in section, which comprises a vertical side face 64a and a slanting surface 64c aslant extended in the direction of a first main surface 12a as viewed from a lower end 64b of the side face 64a may be used as shown in FIG. 7A. By doing so, the concave portion 64 takes such a shape that the depth at a sidewall surface on the gate electrode 48 side becomes the deepest. Therefore, a stress relaxation layer 14 charged into the concave portion 64 can exert large vertical stress on a side face 16b of a device forming layer 16. However, the configurational example of FIG. 7A is suitable for application to a case in which an n-MOSFET 20 is formed in the device forming layer 16 on the deepest side of the concave portion 64.

Figure 7B:
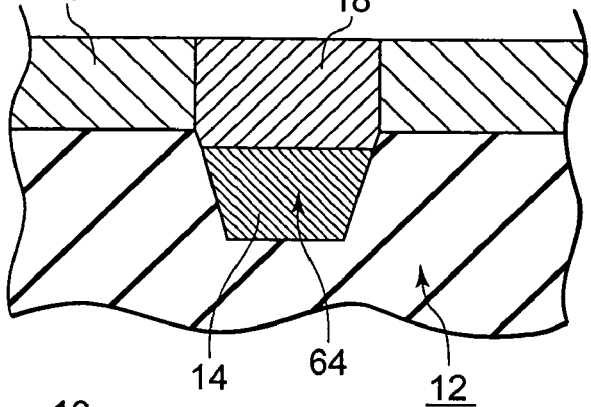
Figure 7C:
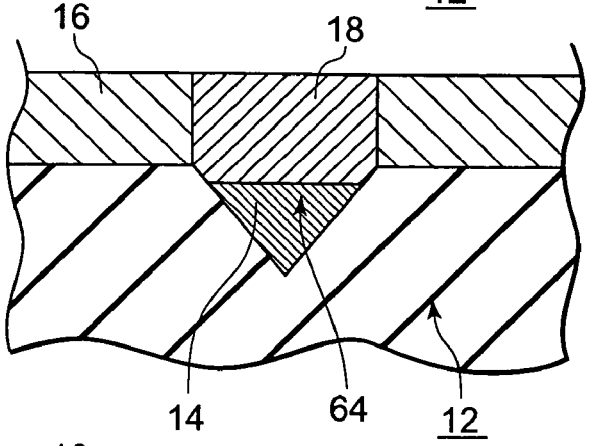
Figure 7D:
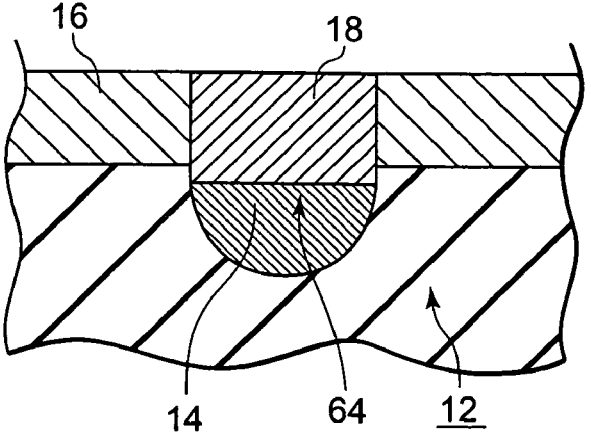

Although the magnitude of the vertical stress exerted on the side face 16b of the device forming layer 16 becomes small, for example, such a mesa shape as shown in FIG. 7B, such a triangular form as shown in FIG. 7C and such a hemispheric concave portion 64 as shown in FIG. 7D may be used as the shape of a sectional cut area of the concave portion 64. Thus, in the case of the concave portions 64 each having the shape symmetric in sectional cut area, such concave portions are suitable for application even to a case in which n-MOSFETs are formed on both sides thereof.

Figure 8A:
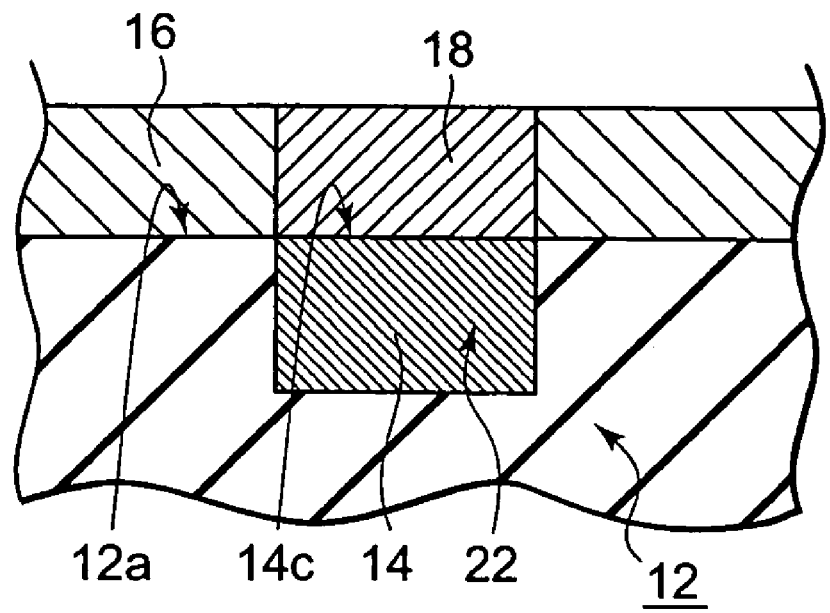
FIG. 8 is a fragmentary enlarged sectional view for describing a modification of the semiconductor device according to the embodiment.
Figure 8B:
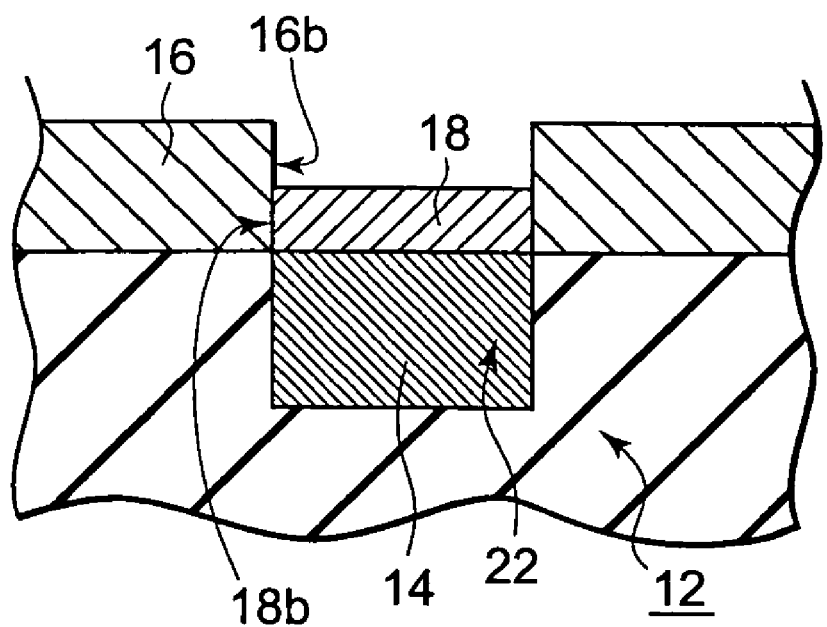

In the present embodiment, the height of the stress relaxation layer 14 is formed lower than the depth of each concave portion 22 in consideration of the electrical insulating property of the device forming layer 16. However, if the electrical insulating property relative to the device forming layer 16 is ensured to such an extent that the occurrence of a leak current can be prevented, then the height of a stress relaxation layer 14 may be made equal to the depth of a concave portion 22 as shown in FIG. 8A. That is, the height of an upper surface 14c of the stress relaxation layer 14 and the height of a first main surface 12a may be identical. Since the height of the stress relaxation layer 14 can be set high as compared with the present embodiment by doing so, compression stress in a parallel direction, which acts on the device forming layer 16, can be relaxed more effectively.

In the present embodiment as well, the whole area of each side face 16b of the device forming layer 16 is mated with its corresponding side face 18b of the stress transfer layer 18 to more effectively relax the compression stress in the parallel direction exerted on the device forming layer 16. However, part (lower half, for example) of a side face of a device forming layer 16 18 may be mated with its corresponding side face of a stress transfer layer 18. Although this is slightly reduced in degree as compared with the mating of the full surface with the side face by doing so, it is possible to relax the parallel-direction compression stress exerted on the device forming layer 16 with a sufficient level from a practical standpoint.

While the preferred forms of the present invention have been described, it is to be understood that modifications will be apparent to those skilled in the art without departing from the spirit of the invention. The scope of the invention is to be determined solely by the following claims.

What is claimed is:

1. A semiconductor device comprising:
   an insulative substrate;
   concave portions that extend from a main surface of the insulative substrate into the insulative substrate;
   stress relaxation layers in the concave portions and each having an upper surface parallel to the main surface of the insulative substrate;
   a device forming layer which covers the main surface of the insulative substrate and extends from an outer edge of one of the concave portions to an outer edge of an other of the concave portions;
   insulative stress transfer layers in contact with upper surfaces of the stress relaxation layers and side faces of the device forming layer; and
   a device configured using the device forming layer, wherein the insulative substrate has a thermal expansion coefficient that is larger than a thermal expansion coefficient of the stress relaxation layers and the device forming layer, and wherein the insulative substrate and the insulative stress transfer layers have rigidity higher than rigidity of the stress relaxation layers and the device forming layer.

2. The semiconductor device according to 1, wherein the insulative substrate is a sapphire substrate, each of the stress relaxation layers and the device forming layer is a silicon layer, and each of the insulative stress transfer layers is an SiO$_2$ layer.

3. The semiconductor device according to claim 2, wherein the upper surfaces of the stress relaxation layers are respectively lower than the main surface of the insulative substrate.

4. The semiconductor device according to claim 2, wherein the upper surfaces of the stress relaxation layers respectively have a same height as the main surface of the insulative substrate.

5. The semiconductor device according to claim 2, wherein a depth of each of the concave portions is greatest at a wall surface adjacent the device.

6. The semiconductor device according to claim 5, wherein the device forming layer includes an n channel MOS field effect transistor as the device, and the concave portions have lengths greater than or equal to a gate width of the n channel MOS field effect transistor, and are provided in pairs along a gate length direction of the n channel MOS field effect transistor with the n channel MOS field effect transistor interposed therebetween.

7. The semiconductor device according to claim 2, wherein the SiO$_2$ layers are field oxide films.

8. A semiconductor device comprising:

a substrate having concave portions in a main surface thereof, each of the concave portions having stress relaxation layers therein, upper surfaces of the stress relaxation layers being parallel with respect to the main surface of the substrate;

a device forming layer covering the main surface of the substrate between the concave portions, the device forming layer having a device therein; and insulative stress transfer layers on the stress relaxation layers and abutted with the device forming layer covering the main surface of the substrate, the substrate having a thermal expansion coefficient greater than a thermal expansion coefficient of the stress relaxation layers and the device forming layer, and the substrate and the insulative stress transfer layers having a rigidity greater than rigidity of the stress relaxation layers and the device forming layer.

9. The semiconductor device according to claim 8, wherein the insulative stress transfer layers extend into the concave portions of the substrate.

10. The semiconductor device according to claim 8, wherein each of the stress relaxation layers has an uppermost surface that is coplanar with the main surface of the substrate.

11. The semiconductor device according to claim 8, wherein each of the stress transfer layers has an uppermost surface that is coplanar with an uppermost surface of the device forming layer.

12. The semiconductor device according to claim 8, wherein each of the insulative stress transfer layers has an uppermost surface that is non-coplanar with an uppermost surface of the device forming layer.

13. The semiconductor device according to claim 8, wherein the stress relaxation layers have triangular cross-sectional shape.

14. The semiconductor device according to claim 8, wherein the stress relaxation layers have hemispherical cross-sectional shape.

15. The semiconductor device according to claim 8, wherein the stress relaxation layers have mesa-like cross-sectional shape.

16. The semiconductor device according to claim 8, wherein the concave portions have wedge-like shape, and a depth of the concave portions is greatest at a side wall of the concave portions adjacent the device forming layer.

* * * * *